United States Patent
Furukawa

(10) Patent No.: US 11,237,207 B2
(45) Date of Patent: Feb. 1, 2022

(54) SEMICONDUCTOR TEST SOCKET WITH A FLOATING PLATE AND LATCH FOR HOLDING THE SEMICONDUCTOR DEVICE

(71) Applicant: SENSATA TECHNOLOGIES, INC., Attleboro, MA (US)

(72) Inventor: Hideharu Furukawa, Norton, MA (US)

(73) Assignee: Sensata Technologies, Inc., Attleboro, MA (US)

( * ) Notice: Subject to any disclaimer, the term of this patent is extended or adjusted under 35 U.S.C. 154(b) by 130 days.

(21) Appl. No.: 16/694,011

(22) Filed: Nov. 25, 2019

(65) Prior Publication Data

US 2021/0156906 A1    May 27, 2021

(51) Int. Cl.
*G01R 31/28* (2006.01)

(52) U.S. Cl.
CPC ..... *G01R 31/2863* (2013.01); *G01R 31/2874* (2013.01)

(58) Field of Classification Search
CPC .. G01R 1/0433; G01R 1/0408; G01R 1/0458; G01R 1/0466; G01R 1/0483; G01R 31/2831; G01R 31/2863; G01R 31/2874; G01R 31/2601; G01R 31/2642; G01R 31/26; G01R 1/04; G01R 1/073; H01R 12/88; H01R 13/24; H01R 13/41; H01R 13/193; H01R 12/00; H01R 33/76; H01R 1/0483; H05K 7/10; H05K 7/12; H01L 23/32; H01L 2924/0002; H01L 22/30
See application file for complete search history.

(56) References Cited

U.S. PATENT DOCUMENTS

| | | | |
|---|---|---|---|
| 5,518,410 A * | 5/1996 | Masami | H01R 13/2485 324/750.25 |
| 5,971,156 A | 10/1999 | Slocum et al. | |
| 6,193,525 B1 | 2/2001 | Takayama | |
| 6,350,138 B1 * | 2/2002 | Atobe | H05K 7/1069 439/266 |

(Continued)

FOREIGN PATENT DOCUMENTS

WO    200067540 A1    11/2000

OTHER PUBLICATIONS

International Search Report issued in related application Serial No. PCT/US2020/060887 dated Feb. 9, 2021, (13 pages).

*Primary Examiner* — Vinh P Nguyen
(74) *Attorney, Agent, or Firm* — Mark H. Whittenberger, Esq.; Holland & Knight LLP

(57) ABSTRACT

A test socket assembly for a semiconductor device used for burn-in testing comprising a base assembly, a floating plate coupled to the base assembly, and a latch assembly mounted on the floating plate for the retention and movement of the semiconductor device. The base assembly further includes a pin assembly for electrically coupling to the semiconductor device for burn-in testing and at least two upstanding flex arms. In addition, the floating plate and the latch assembly move to a test position for accommodating a varying height of the semiconductor device when mating with a test fixture while the latch still effectively retains the semiconductor device. Lastly, the floating plate is held in a fixed load position due to the support provided by the upstanding flex arms when inserting the semiconductor device into the test socket.

15 Claims, 13 Drawing Sheets

(56) References Cited

U.S. PATENT DOCUMENTS

| | | | |
|---|---|---|---|
| 7,819,686 B2* | 10/2010 | Chen | G01R 1/0466 |
| | | | 439/330 |
| 7,988,500 B2 | 8/2011 | Furukawa et al. | |
| 8,388,365 B2 | 3/2013 | Takahashi et al. | |
| 8,602,805 B2 | 12/2013 | Takahashi et al. | |
| 10,288,644 B2* | 5/2019 | Iy | G01R 1/0483 |
| 11,047,905 B2* | 6/2021 | Lim | G01R 31/2896 |
| 2003/0054675 A1 | 3/2003 | Ikeya | |
| 2004/0137774 A1* | 7/2004 | Shimizu | H01R 12/88 |
| | | | 439/268 |
| 2011/0045682 A1* | 2/2011 | Lin | G01R 1/0458 |
| | | | 439/331 |
| 2017/0176493 A1* | 6/2017 | Iy | G01R 1/0483 |

* cited by examiner

SEMICONDUCTOR TEST SOCKET WITH A FLOATING PLATE AND LATCH FOR HOLDING THE SEMICONDUCTOR DEVICE

FIELD OF THE DISCLOSURE

The subject disclosure relates to a socket for a semiconductor device for burn-in testing and more particularly to a socket with a floating plate and latch for holding the semiconductor device.

BACKGROUND

Semiconductor devices, such as integrated circuits (IC), are subjected to testing, which often applies high temperature. The burn-in test can remove the occurrence of defects of the semiconductor devices within a predetermined period and prevent shipment of faulty devices. Typically, a thermal unit such as a heat sink or heating plate contacts the body of the semiconductor device during burn-in testing. The success of the burn-in test is highly dependent on the flushness of the contact between the thermal unit and the body of the semiconductor device no gap between the thermal unit and the body of the semiconductor device). U.S. Pat. No. 8,388,365B2 and U.S. Pat. No. 8,602,805B2 present sockets for testing, each of which is incorporated herein by reference.

To be able to accommodate increased test density, multiple semiconductor devices are subject to the thermal burn-in test simultaneously. The semiconductor devices are held in a test socket and the test sockets are arranged in a large pattern. Then, a singular thermal unit contacts the multiple semiconductor devices at the same time. However, the high density testing reduces the efficiency of the thermal testing because the variable thicknesses of different semiconductor devices prevent the thermal unit from making efficient contact with the semiconductor devices for heating or cooling. There may also be variability in the height of the testing socket, heating element and/or cooling element that further prevents proper mating between the semiconductor devices being tested and the thermal unit.

SUMMARY

In view of the above, what is needed is a test socket for burn-in testing of semiconductor devices, such as IC chips, which provides proper contact between the thermal unit and the semiconductor devices during the testing even when the height of the semiconductor devices or other elements varies. The subject technology relates to a semiconductor burn-in test socket with a floating plate and opposing latches for holding the semiconductor device that moves to accommodate the varying heights.

One embodiment of the present disclosure is directed to a test socket assembly for burn-in testing of a semiconductor device comprising a base assembly including a pin assembly for electrically coupling to the semiconductor device for burn-in, a floating plate coupled to the base assembly, and opposing latches mounted on the floating plate for movement and retention of the semiconductor device. The floating plate and the opposing latches move to a test position for accommodating a varying height of the semiconductor device when mating with a test fixture, while the latch still effectively retains the semiconductor device.

Another embodiment of the present disclosure is directed to a test socket assembly for burn-in testing of a semiconductor device comprising a base assembly including a pin assembly for electrically coupling to the semiconductor device for burn-in, at least one upstanding flex arm, and a floating plate coupled to the base assembly. The upstanding flex arm supports the floating plate in a fixed load position when inserting the semiconductor device into the test socket.

Still another embodiment of the present disclosure is directed to a test socket assembly for burn-in testing of a semiconductor device comprising a base assembly including a pin assembly for electrically coupling to the semiconductor device for burn-in, at least one upstanding flex arm, a floating plate coupled to the base assembly, and a latch assembly mounted on the floating plate for movement and retention of the semiconductor device. The floating plate and the latch assembly move to a test position for accommodating a varying height of the semiconductor device when mating with a test fixture, while the latch still effectively retains the semiconductor device. The upstanding flex arm (s) supports the floating plate in a fixed load position when inserting the semiconductor device into the test socket.

It should be appreciated that the subject technology can be implemented and utilized in numerous ways, including without limitation as a process, an apparatus, a system, a device, a method for applications now known and later developed. These and other unique features of the system disclosed herein will become more readily apparent from the following description and the accompanying drawings.

BRIEF DESCRIPTION OF THE DRAWINGS

Various aspects of the disclosure are discussed herein with reference to the accompanying Figures. It will be appreciated that for simplicity and clarity of illustration, elements shown in the drawings have not necessarily been drawn accurately or to scale. For example, the dimensions of some of the elements may be exaggerated relative to other elements for clarity or several physical components may be included in one functional block or element. Further, where considered appropriate, reference numerals may be repeated among the drawings to indicate corresponding or analogous elements. For purposes of clarity, however, not every component may be labeled in every drawing. The Figures are provided for the purposes of illustration and explanation and are not intended as a definition of the limits of the disclosure.

DETAILED DESCRIPTION

Figure 1A:
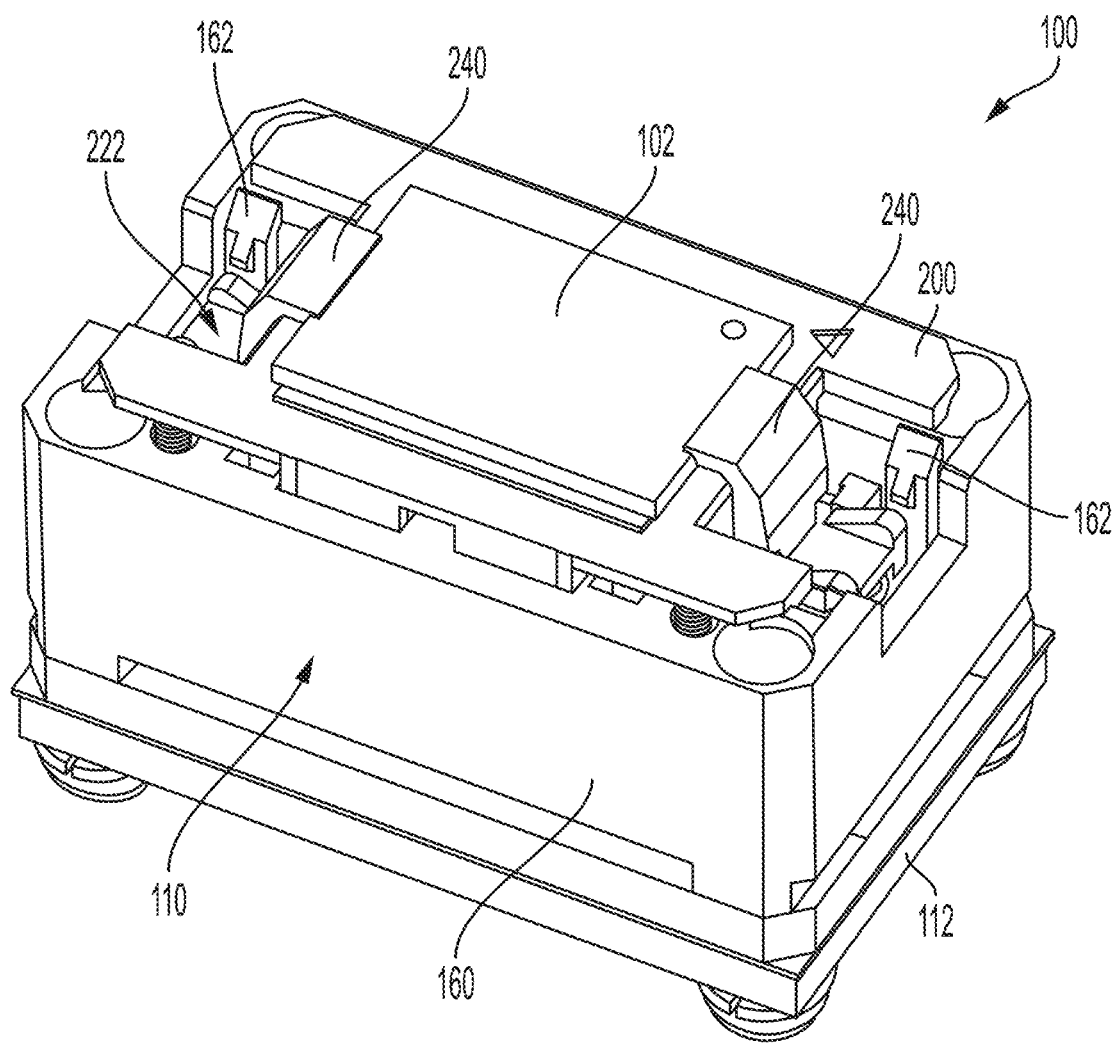
FIG. 1A shows a perspective view of a socket used for semiconductor device burn-in testing with the semiconductor device loaded in accordance with the subject technology.

The subject technology overcomes many of the known problems associated with ensuring good contact between semiconductor devices mounted in test sockets and a thermal unit during thermal testing of the semiconductor devices. The advantages, and other features of the technology disclosed herein, will become more readily apparent to those having ordinary skill in the art from the following detailed description of certain exemplary embodiments taken in combination with the drawings and wherein like reference numerals identify similar structural elements. It should be noted that directional indications such as top, bottom, vertical, horizontal, inward, outward, upward, downward, right, left and the like, are used with respect to the figures and not meant in a limiting manner.

Figure 1B:
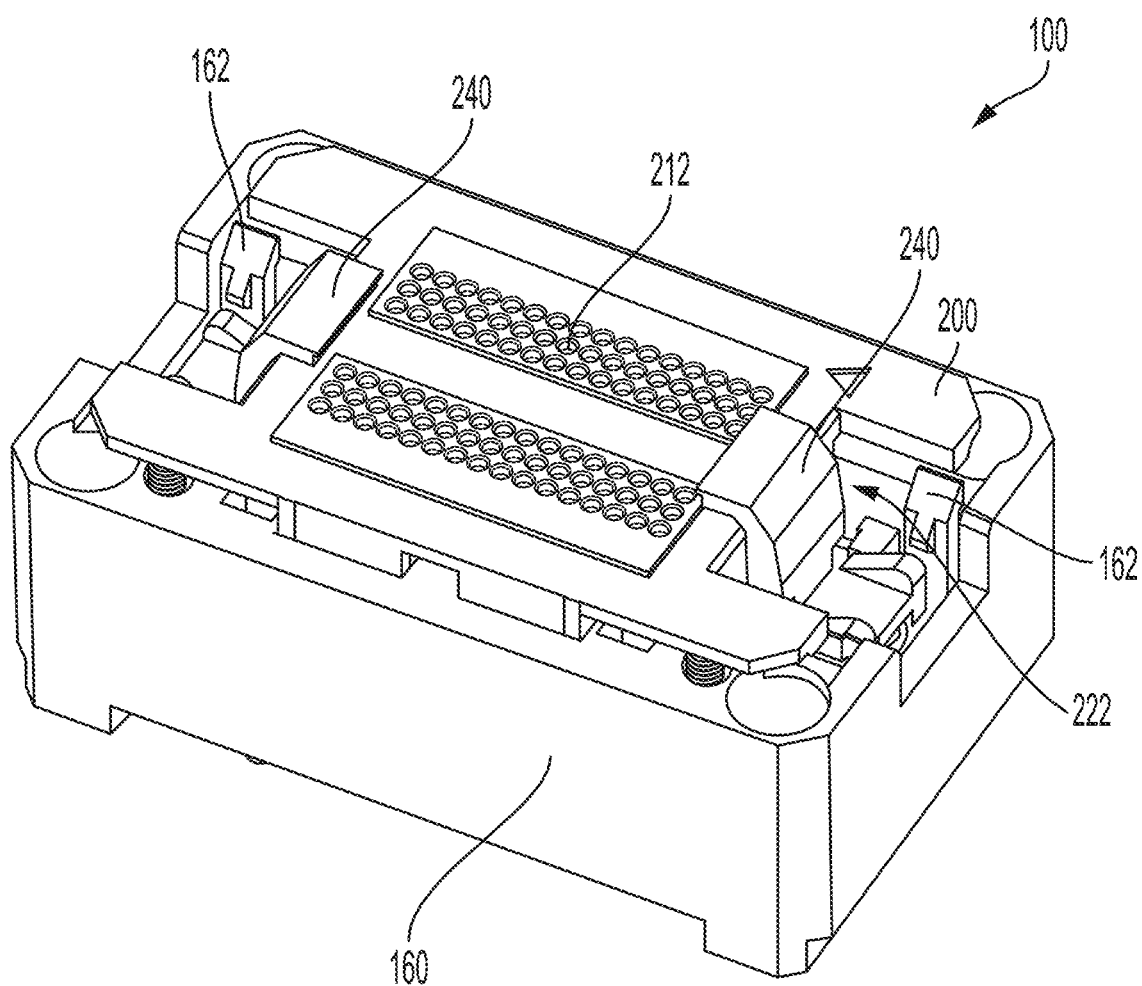
FIG. 1B shows a perspective view of the socket of FIG. 1A used for semiconductor device burn-in testing without the semiconductor device in accordance with the subject technology.

Referring to FIGS. 1A and 1B, perspective assembled views of a test socket 100 used for semiconductor device burn-in testing are shown. FIG. 1A depicts the test socket 100 with a semiconductor device 102 loaded thereon (e.g., test position). FIG. 1B depicts the test socket 100 before the semiconductor device 102 is loaded with several lower components omitted for clarity. The semiconductor device 102 may be an integrated circuit (IC) and the like.

The test socket 100 includes a base assembly 110 including a main body 160 with four upstanding flex arms 162. A floating plate 200 slidably couples to the base assembly 110. Two opposing latches 240 mount on the floating plate 200 for movement therewith and for retaining the semiconductor device 102 thereto. The floating plate 200 is biased upwards. In another embodiment, the main body 160 has fewer upstanding flex arms such as two or three. When viewed from above, the floating plate 200 is somewhat H-shaped so that four corners 220 form opposing gaps 222.

When the semiconductor device 102 is loaded as shown in FIG. 1A, the floating plate 200 and the latches 240 freely move downward for accommodating a varying height of the semiconductor device 102 when mating with a test fixture (e.g., partially shown in FIG. 5) while the latches 240 still effectively retain the semiconductor device 102. When inserting the semiconductor device 102 into the test socket 100, the floating plate 200 is supported in a fixed load position as described below with respect to FIGS. 4A-D.

Figure 2A:
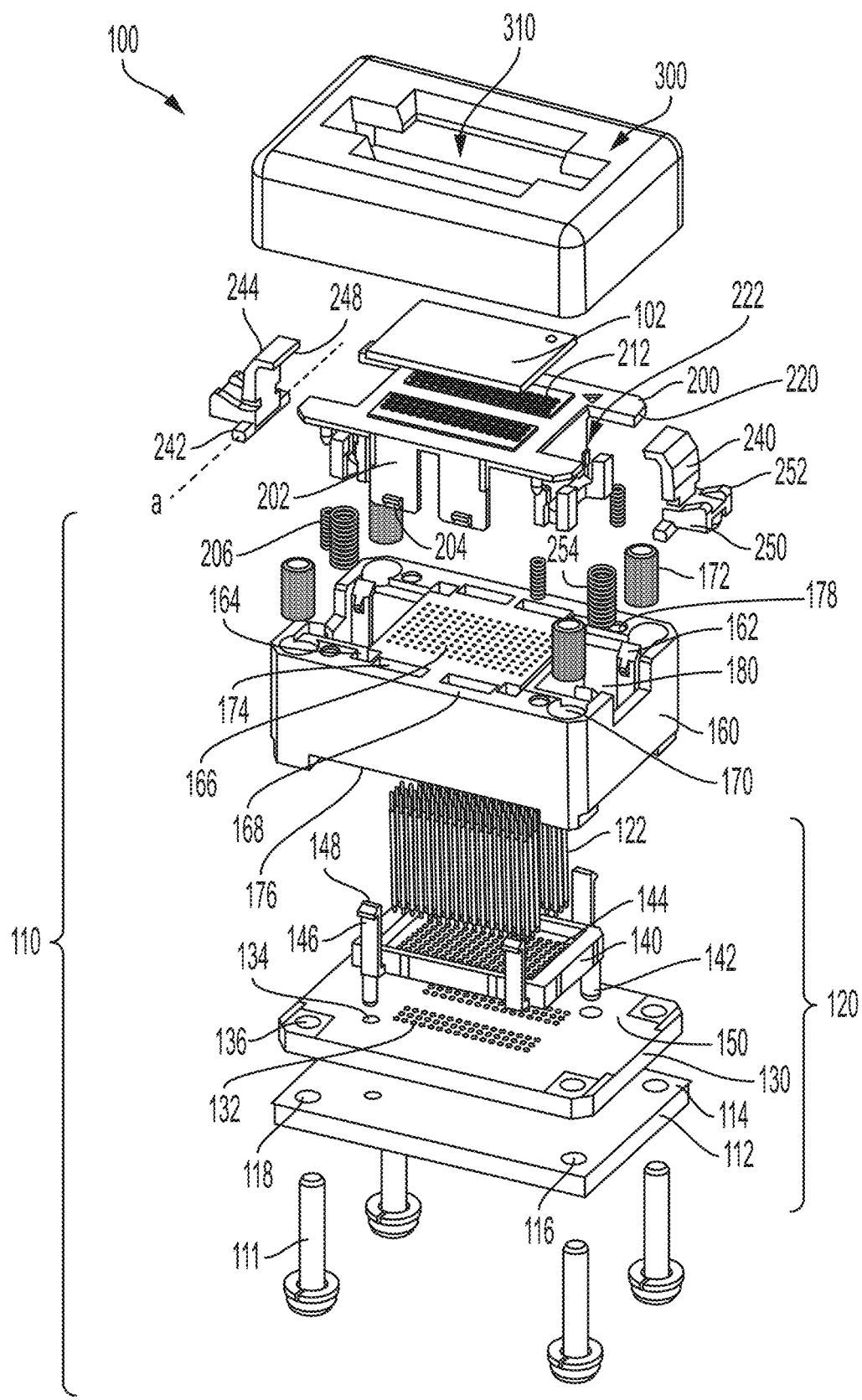
FIG. 2A shows a perspective exploded view of the test socket of FIGS. 1A and 1B.
Figure 2B:
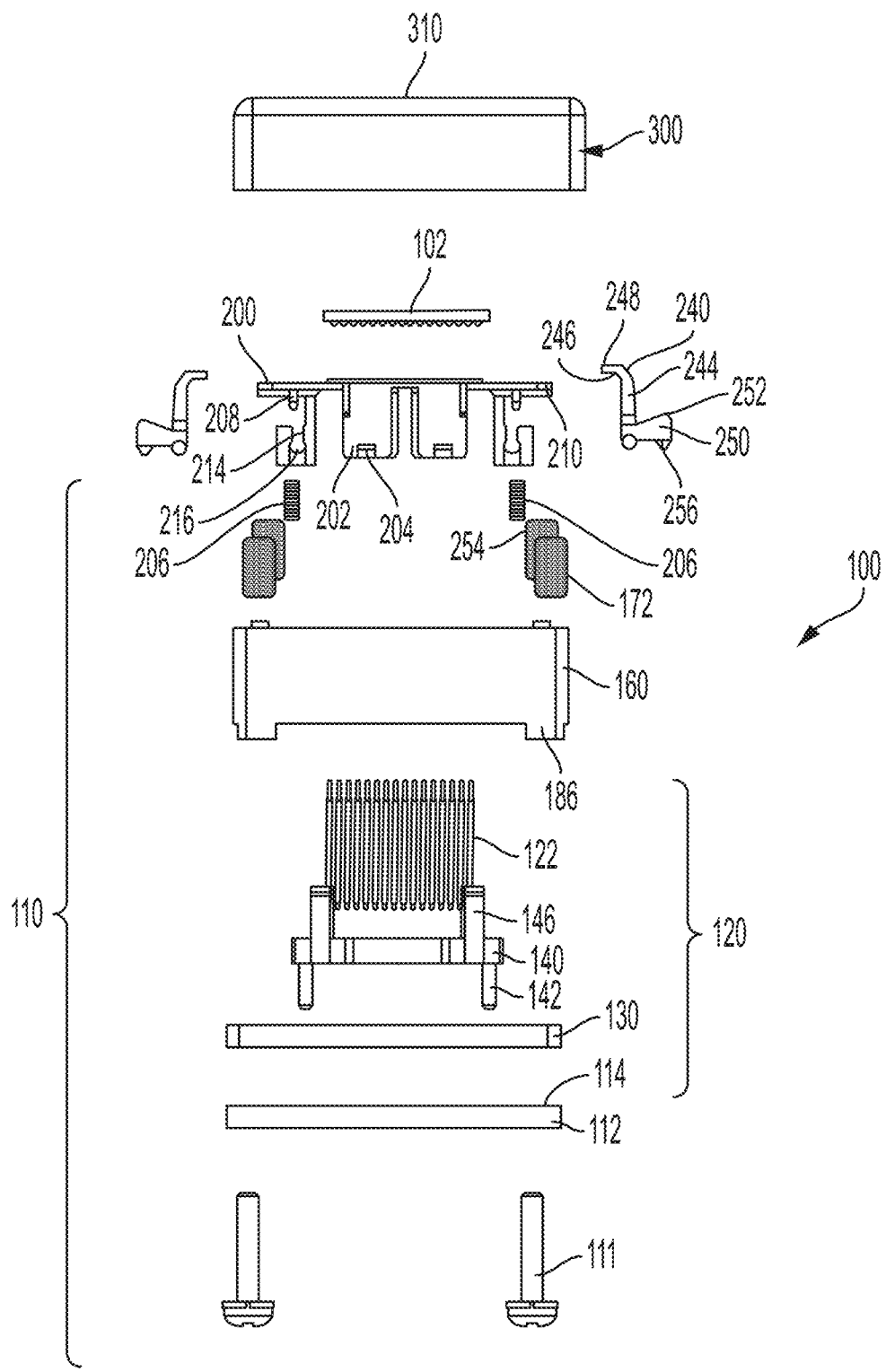
FIG. 2B shows a front-facing exploded view of the test socket of FIGS. 1A and 1B.
Figure 2C:
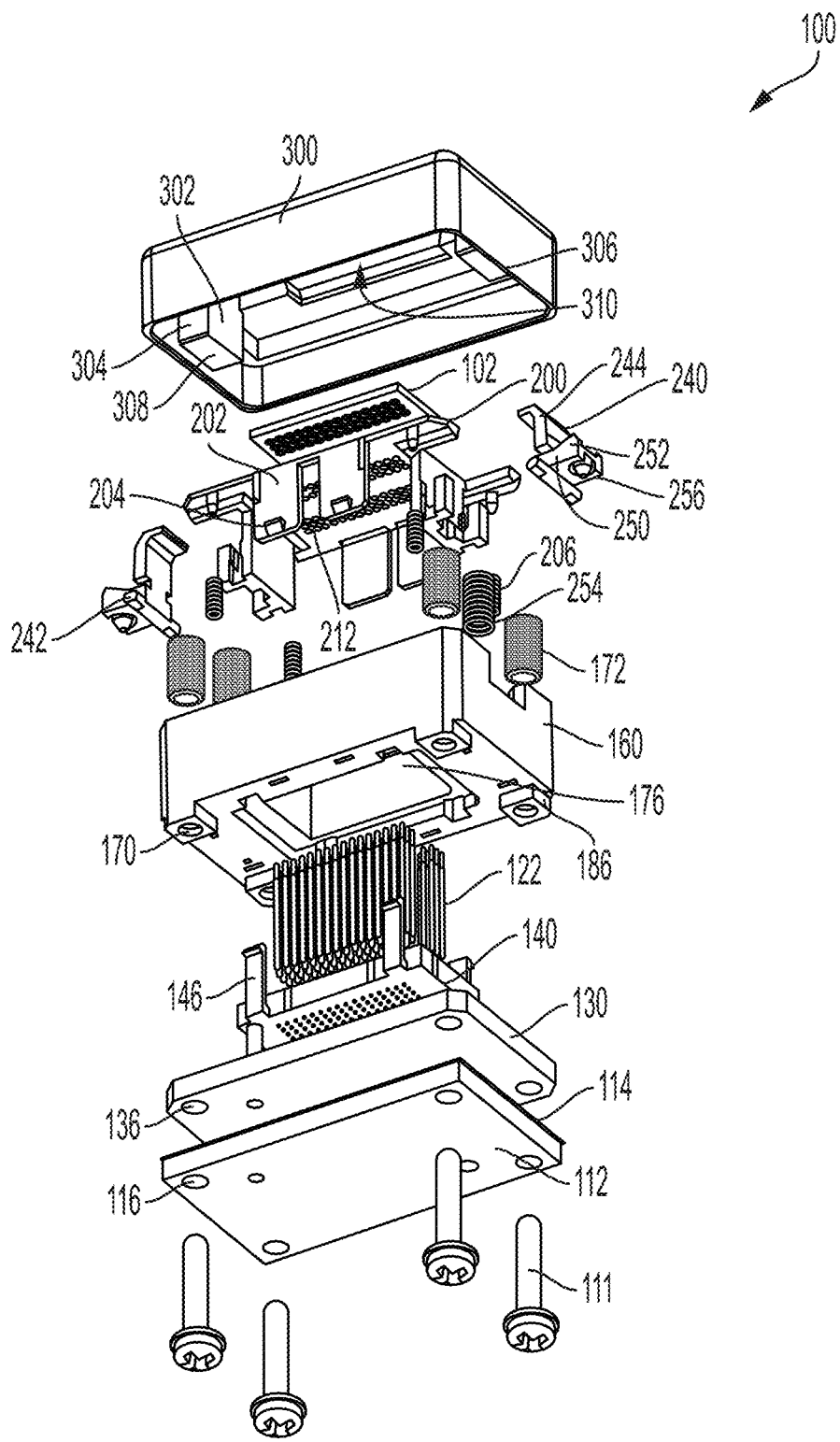
FIG. 2C shows a bottom perspective exploded view of the test socket of FIGS. 1A and 1B.

Referring additionally to FIGS. 2A-C, top perspective, front-facing and bottom perspective exploded views of the test socket 100 are shown, respectively. In the base assembly 110, the main body 160 couples to a pin assembly 120. The base assembly 110 also includes a rectangular backing plate 112 with an insulator sheet 114 below the pin assembly 120.

The pin assembly 120 includes a burn-in board 130 that sits on the insulator sheet 114. The burn-in board 130 forms an array 132 of lands or pads for receiving a plurality of contact pins 122 by compression mounting. The contact pins 122 are preferably pogo pins. A stopper 140 is connected to the main body 160 to contain the contact pins 122. The stopper 140 also has two depending circular columns 142 that fit into circular slots 134 of the burn-in board 130 and backing plate 112, respectively. The contact pins 122 also pass through an array 144 of holes formed in the stopper 140. The stopper 140 has four upstanding deflectable fingers 146, each finger 146 having a distal catch 148 on a top side 150 of the stopper 140. Each finger 146 snap fits into a hole 164 formed in the main body 160 so that a top surface 168 of the main body 160 acts a ledge to hold the respective catch 148 in place. The contact pins 122 also align and pass through an array 166 of holes in the main body 160 to connect with the semiconductor device 102 when loaded.

The main body 160, burn-in board 130, insulator 114, and backing plate 112 all have four corner through holes 170, 136, 118, 116, respectively. Insert nuts 172 are fixed in the corner holes 170 of the main body 160. The insert nuts 172 have inner threads to capture screws 111 passing through the corner through holes 170, 136, 118, 116 to hold the pin assembly 120 and main body 160 together to form the base assembly 110.

Still referring to FIGS. 2A-C, the floating plate 200 slidably couples to the main body 160 by inserting four depending tongues 202 into slots 174 formed in the main body 160. Each tongue 202 has a snap feature 204 that catches on a recessed bottom portion 176 of the main body 160. As a result, the tongues 202 can freely move further into the slot 174 but cannot be retracted because the snap feature 204 catches on the bottom portion 176. The wide and flat size and shape of the tongues 202 and slots 174 prevents rotation of the floating plate 200 with respect to the main body 160, effectively guiding the sliding movement of the floating plate 200.

The floating plate 200 is biased upwards from the main body 160 by four floating plate springs 206 fit into their respective floating spring circular slots 178 on the main body 160. As best seen in FIG. 2B, the floating plate 200 has spring guides 208 fitting into each of the floating plate springs 206 to ensure the floating plate springs 206 are properly positioned. The main body 160 forms end cavities 180 for receiving the floating plate 200 and the latches 240.

Opposing pairs of flexible arms 162 are upstanding in the cavities 180 for supporting the floating plate 200 during loading of the semiconductor device 102. The flexible arms 162 each have a distal tip 182 to interact with the complementary contact surface 210 of the floating plate 200. The flexible arms 162 also each have an inward protrusion 184 to interact with the outer sidewalls 304 of the inner shoulder 302 of the loading head 300 when loading the semiconductor device 102.

Although biased upwards, the floating plate 200 can move downward in a controlled manner by the tongues 204 being more deeply inserted into the slots 174. In one embodiment, the maximum travel or float downward of the floating plate 200 is equivalent to a clearance height "h" between the floating plate 200 and the main body 160. The floating plate 200 also includes a plurality of contact pin holes 212 through which the contact pins 122 contact the semiconductor device 102 during testing.

The opposing latches 240 hold the semiconductor device 102 stably on the floating plate 200 during burn-in testing (e.g., the test position). The opposing latches 240 fit onto the floating plate 200 so that as the floating plate 200 moves, the latches 240 travel therewith.

Each latch 240 forms a pintle 242. The pintles 242 fit through side slots 214 into pintle channels 216 respectively on the floating plate 200. As a result, the latches 240 rotate about an axis "a" that passes centrally through each pintle 242. Each latch 240 has an upstanding clamp portion 244 that terminates in a chip contact surface 246 with an upper lip 248. Each latch 240 also has a horizontal lever portion 250. Each latch 240 may have an upper banking ramp 252 that interacts with the loading head 300. While the present embodiment depicts upper banking ramps 252 on the latches 240, various other shapes and configurations can serve the same purpose.

The latches 240 are biased to the closed position by latch springs 254 extending between the main body 160 and the lever portion 250. The latch springs 254 are retained in place by a collar 188 (see FIGS. 4B and 4C) formed in the side cavities 180 of the main body 160 and a retention bump 256 (see FIGS. 2B, 4B and 4C) extending downward from the lever portion 250 of the latches 240. The floating plate 200 has ample clearance space 218 for the latches 240 to rotate freely when mounted thereon.

Still referring to FIGS. 2A-C, a loading head 300 is part of the burn-in test assembly (not shown) for mounting the semiconductor device 102 onto the test socket 100. When the loading head 300 is lowered on the test socket 100, the latches 240 move outward so the semiconductor device 102 can be loaded as described in more detail below. Once the semiconductor device 102 is inserted, the loading head 300 is removed so that the latches 240 engage and secure the semiconductor device 102 in place for burn-in testing.

As best seen in FIG. 2C, the loading head 300 has an inner shoulder 302 on each side 306. The inner shoulder 302 has a bottom surface 308 for selectively contacting the banking ramp 252 of the latch 240 and outer sidewalls 304 for selectively contacting the flexible arms 162 as described in more detail below. The loading head 300 also forms a loading orifice 310 for providing access to the floating plate 200 during loading of the semiconductor device 102. The loading head 300 also has an upper flange 312 that seats against the floating plate 200 when the loading head 300 is fully inserted onto the test socket 100.

Loading the Semiconductor Device on the Test Socket

Once assembled, the test socket 100 is placed in a large array of similar test sockets. The array may be more or less than 256 so that large numbers of semiconductor devices 102 can be quickly and simultaneously loaded on to a respective test socket 100 and subjected to burn-in testing. As a result, manufacturing bottlenecks due to burn-in testing can be alleviated.

FIGS. 4A-E detail the process of loading a single semiconductor device 102 on to a single test socket 100 for simplicity. However, it is understood that any number of test sockets 100 may be arranged together with a tooling fixture (not shown) for mounting the plurality of semiconductor devices 102, said tooling fixture having a plurality of IC loading heads 300 arranged to interact with the plurality of test sockets 100.

Figure 3:
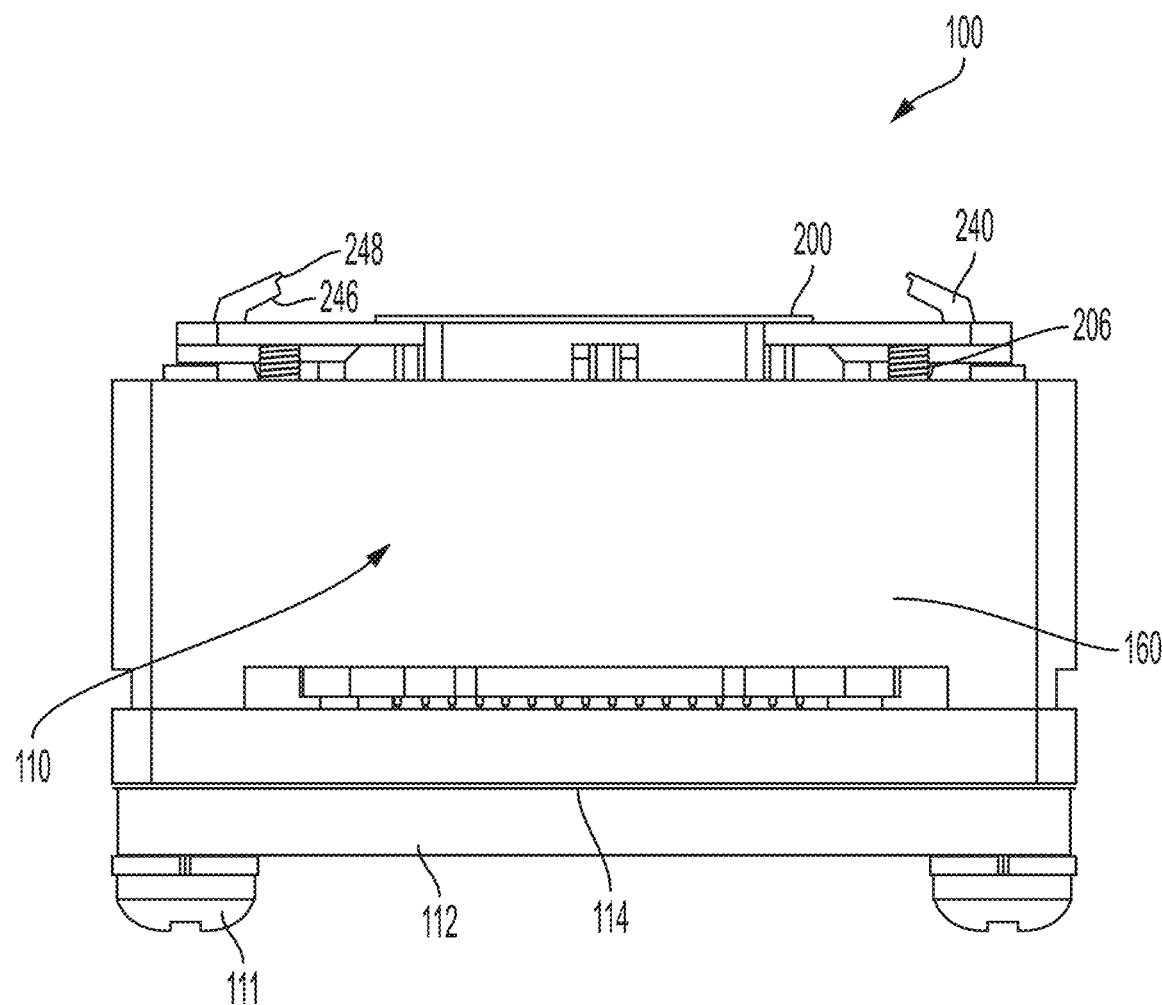
FIG. 3 shows a front plan view of the empty test socket of FIGS. 1A and 1B.

In FIG. 3, a front plan view of the empty test socket 100 is shown with the latches 240 open for illustration. It is appreciated that the latches 240 are normally biased closed. The latches 240 remain closed until the loading head 300 forces opening.

Figure 4A:
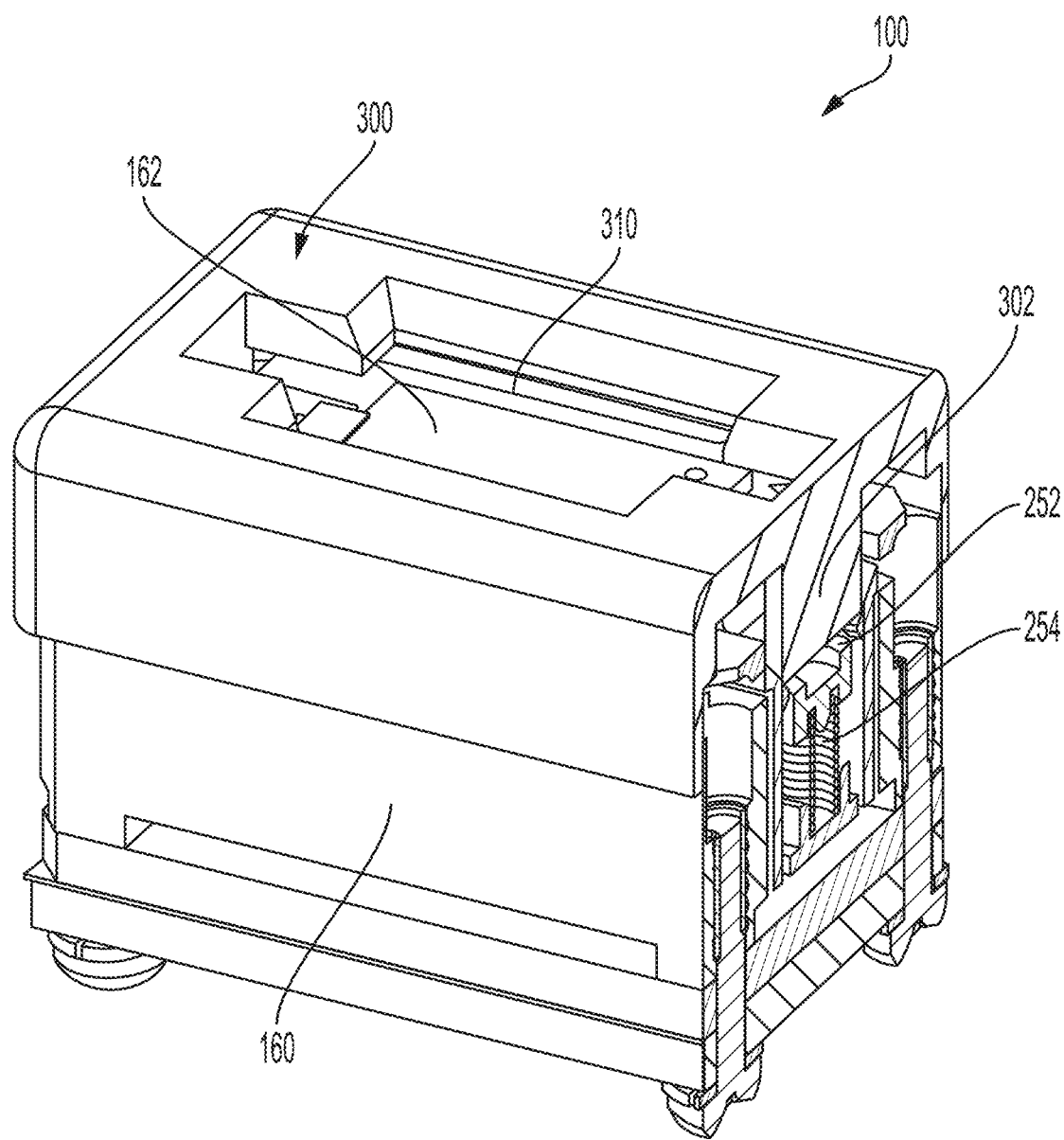
FIG. 4A shows a perspective sectional view of the test socket of FIGS. 1A and 1B with a semiconductor device and loading head thereon.
Figure 4B:
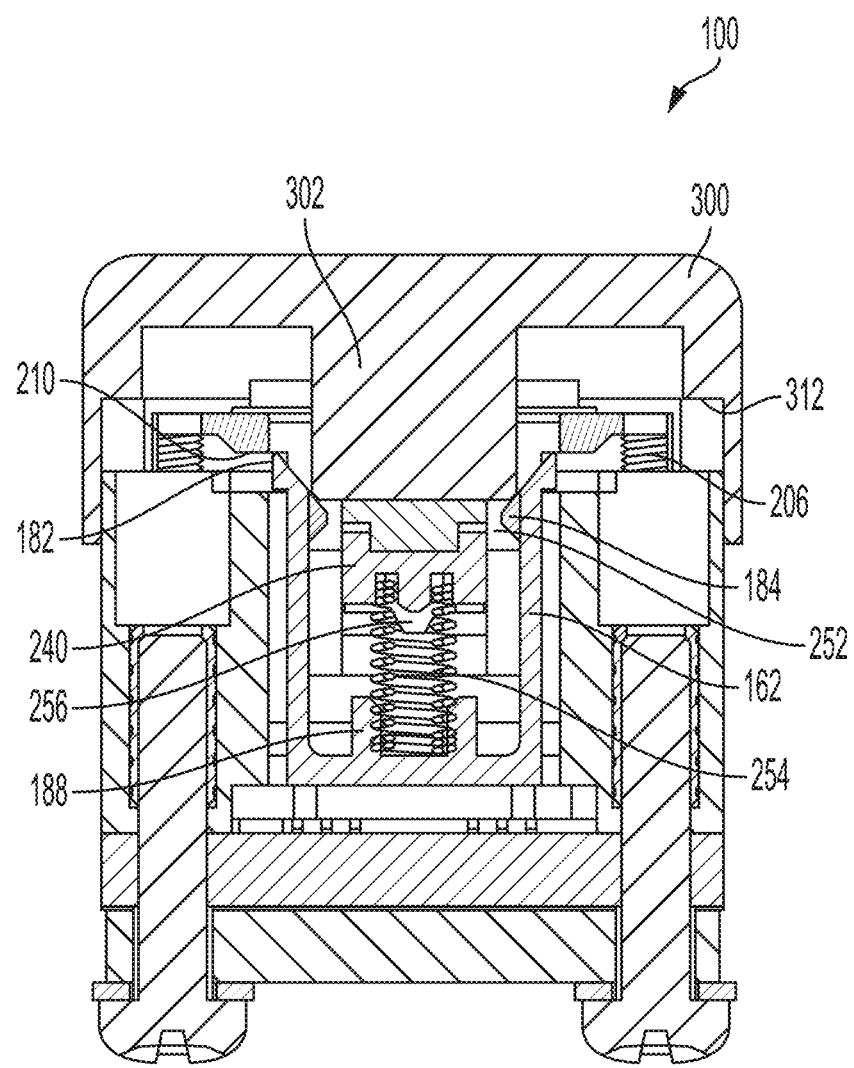
FIG. 4B shows a cross-sectional view of the test socket of FIGS. 1A and 1B having the loading head partially inserted.
Figure 4C:
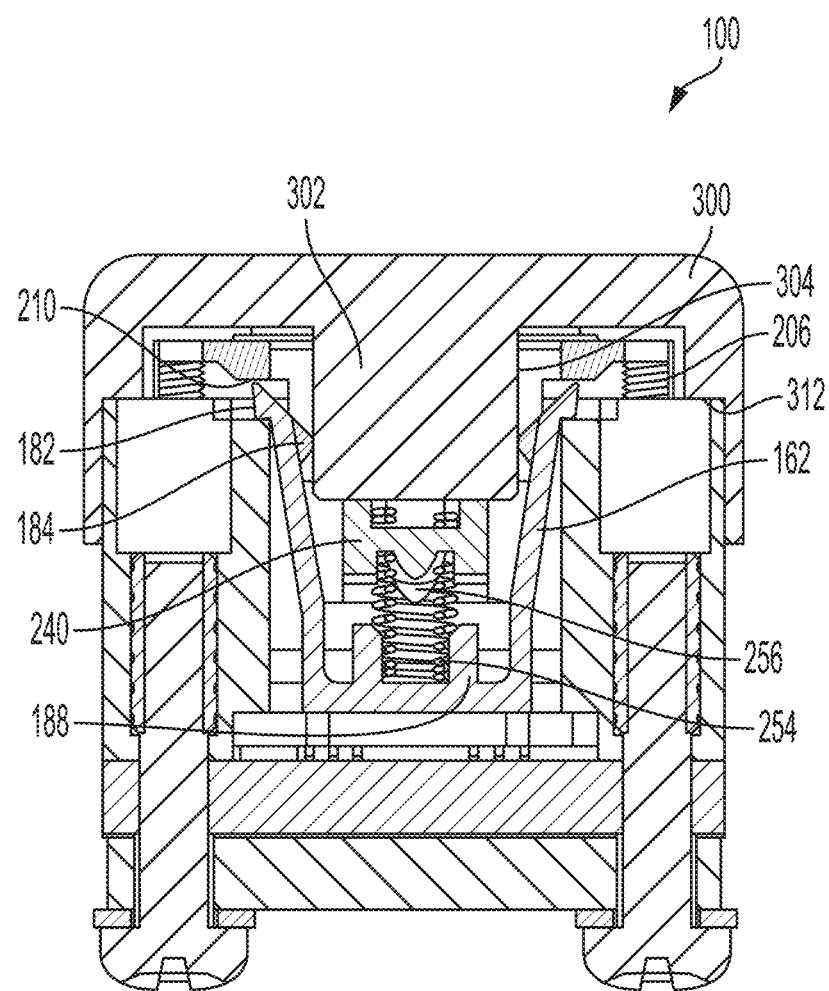
FIG. 4C shows a cross-sectional view of the test socket of FIGS. 1A and 1B in a fixed load position by having the loading head fully inserted thereon.

Referring now to FIGS. 4A and 4B, perspective sectional and cross-sectional views of the test socket 100 are shown with the loading head 300 partially inserted. As the loading head 300 is placed downward on to the test socket 100, the inner shoulders 302 contact the flexible arms 162. As shown in FIG. 4C, as the outer sidewalls 304 of the shoulder 302 slide downward against the inward protrusion 184, the flexible arms 162 splay outward. As a result, the tips 182 of the flexible arms 162 contact the complimentary contact surface 210 of the floating plate 200 so that the floating plate 200 no longer moves freely downward. In one embodiment, the floating plate 200 becomes stably positioned for loading of the semiconductor device 102 just by resting on the tips 182. For further stability of the floating plate 200, the tips 182 may become wedged between the contact surface 210 of the floating plate 200 and the ledge 168 of the main body 160. At approximately the same time, the flange 312 of the loading head 300 contacts the main body 160 to limit further downward travel of the loading head 300.

Figure 4D:
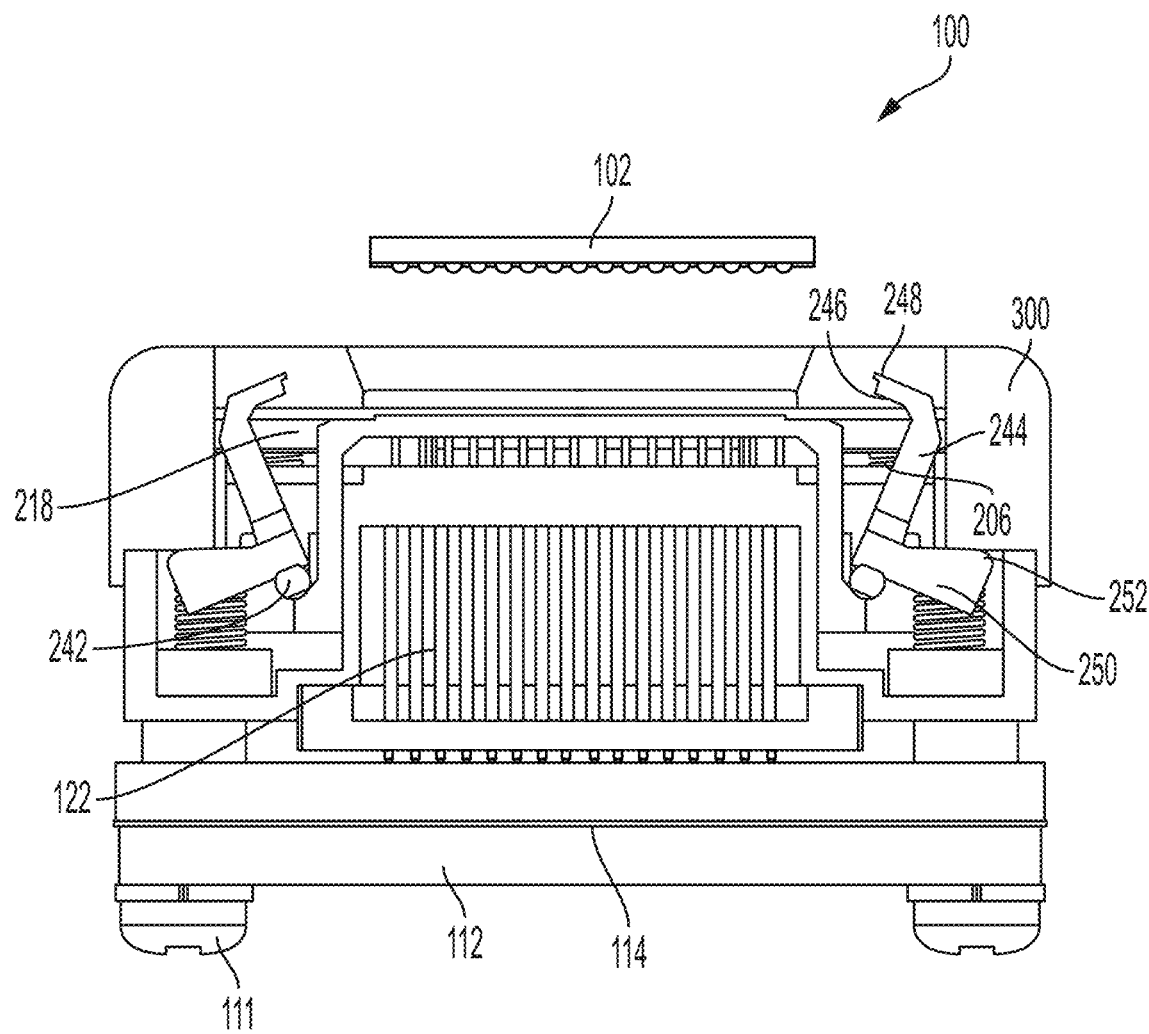
FIG. 4D shows a cross-sectional front view of the test socket of FIGS. 1A and 1B in a fixed load position by having the loading head fully inserted thereon.

Referring now to FIG. 4D, a cross-sectional front view of the test socket 100 in a load position by having the loading head 300 fully inserted is shown. It can be seen in FIG. 4D that the bottom surfaces 308 of the inner shoulders 302 of the loading head 300 contact the banking ramps 252 of the latches 240, exerting a downward force. The downward force causes the latch 240 to rotate about the axis "a" of the pintle 242. As a result, the clamp portion 244 rotates outward from the floating plate 200 and the latch spring 254 compresses (i.e., the latches 240 open) in the load position. Thus, in the load position, not only is the floating plate 200 stabilized but the latches 240 rotate out of the way for easy loading of the semiconductor device 102 through the loading orifice 310 of the loading head 300. It is envisioned but not necessary that a large array of semiconductor devices 102 are simultaneously placed on a large array of test sockets 100.

Figure 4E:
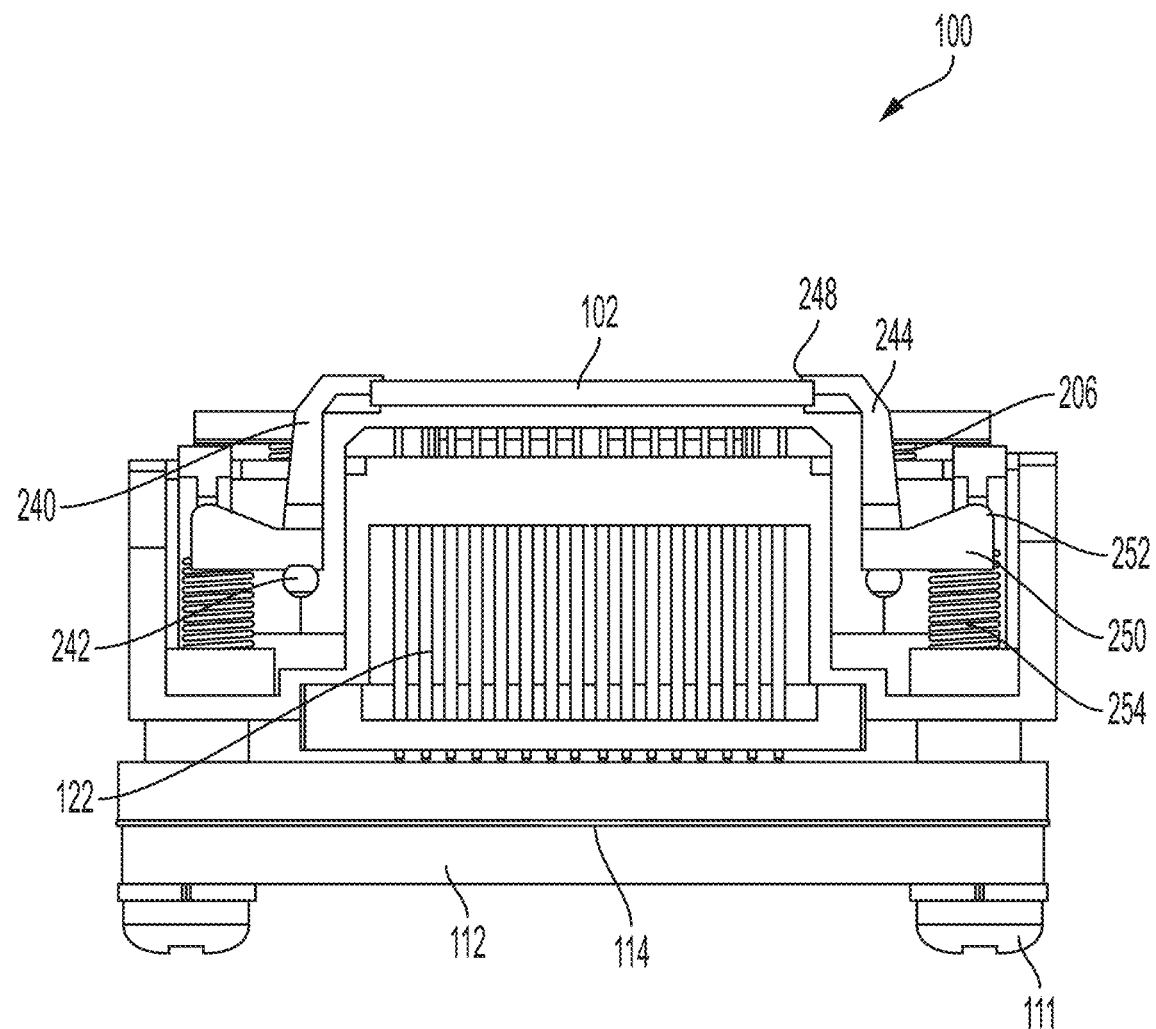
FIG. 4E shows a cross-sectional front view of the socket of FIGS. 1A and 1B with the semiconductor device loaded after the loading head is removed.

Referring now to FIG. 4E, a cross-sectional front view of the test socket 100 of FIG. 1 with the semiconductor device 102 loaded is shown. Once the semiconductor device 102 is positioned on the floating plate 200, the loading head 300 (not shown in this figure) is removed. As the loading head 300 is removed from the test socket 100, the downward force acting on the banking ramps 252 of the latches 240 is removed. The latch springs 254 push up on the respective lever portions 250 causing the clamp portions 244 to rotate inward to contact the semiconductor device 102 on the floating plate 200. The opposing vertical chip contact surfaces 246 may exert enough compressive force to fully retain the semiconductor device 102. However, each claim portion 244 does include an upper lip 248 that enhances the clamp portions 244 hold on the semiconductor device 102. As a result, the semiconductor device 102 is securely loaded on the floating plate 200 and positioned for burn-in testing.

Testing the Semiconductor Device on the Test Socket

Figure 5:
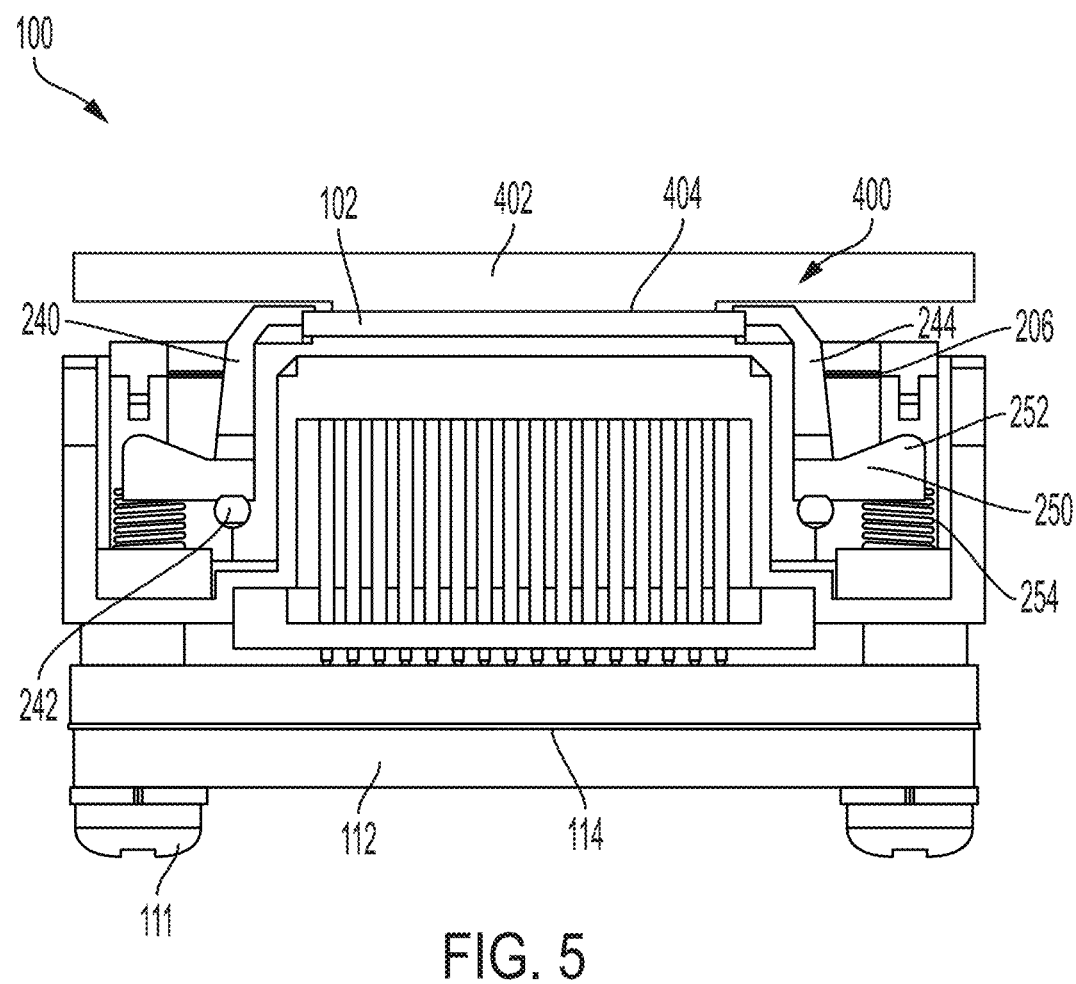
FIG. 5 shows a cross-sectional front view of the socket of FIGS. 1A and 1B with the loaded socket in contact with a thermal unit in accordance with the subject technology.

FIG. 5 shows a cross-sectional front view of the test socket 100 in testing mode with the loaded semiconductor device 102 in contact with a thermal unit 400 (not fully shown) in accordance with the subject technology. The thermal unit 400 includes a heating or cooling element 402 that is part of a larger array that contacts a plurality of semiconductor devices 102 during testing. For burn-in testing, the element 402 is typically a heating element. The element 402 is effectively brought into contact with the semiconductor devices 102 during burn-in testing despite varying height locations of the semiconductor devices 102 because of the movement of the floating plate 200 and latches 240 with the floating plate 200.

The element 402 is substantially planar but includes a depending region 404 sized and configured to fit within the latches 240 but cover most of the respective semiconductor device 102. The element 402 is typically a good heat conductor so that thermal energy applied thereto is readily conducted to or away from the semiconductor device 102.

As the thermal unit 400 moves toward the semiconductor devices 102, the depending regions 404 contact and exert a downward force on each semiconductor device 102. The depending regions 404 and the semiconductor devices 102 all may be at varying heights. However, because the floating plate 200 is slidably mounted and biased upwards by the floating plate springs 206, the depending regions 404 and the semiconductor devices 102 that contact first will not prevent effective contact between the depending regions 404 and the semiconductor devices 102 that contact later. In other words, the high semiconductor devices 102 push the respective floating plate 200 downward and the thermal unit 400 continues to move downward until contact with all of the semiconductor devices 102 without any gaps. As a result, the variable thickness of multiple semiconductor devices 102 or an uneven thermal unit 402 does not prevent effective and efficient burn-in testing.

In another embodiment, the subject technology is directed to a test socket assembly without the upstanding flexible arms on the base assembly. For example, the springs could be selected to provide ample support to the floating plate so that loading of the test socket is still reliably accomplished. In still another embodiment, the test socket assembly does not utilize latches. Instead, the device being test is held securely enough by the pins being inserted so that the latches are not needed.

Figure 6:
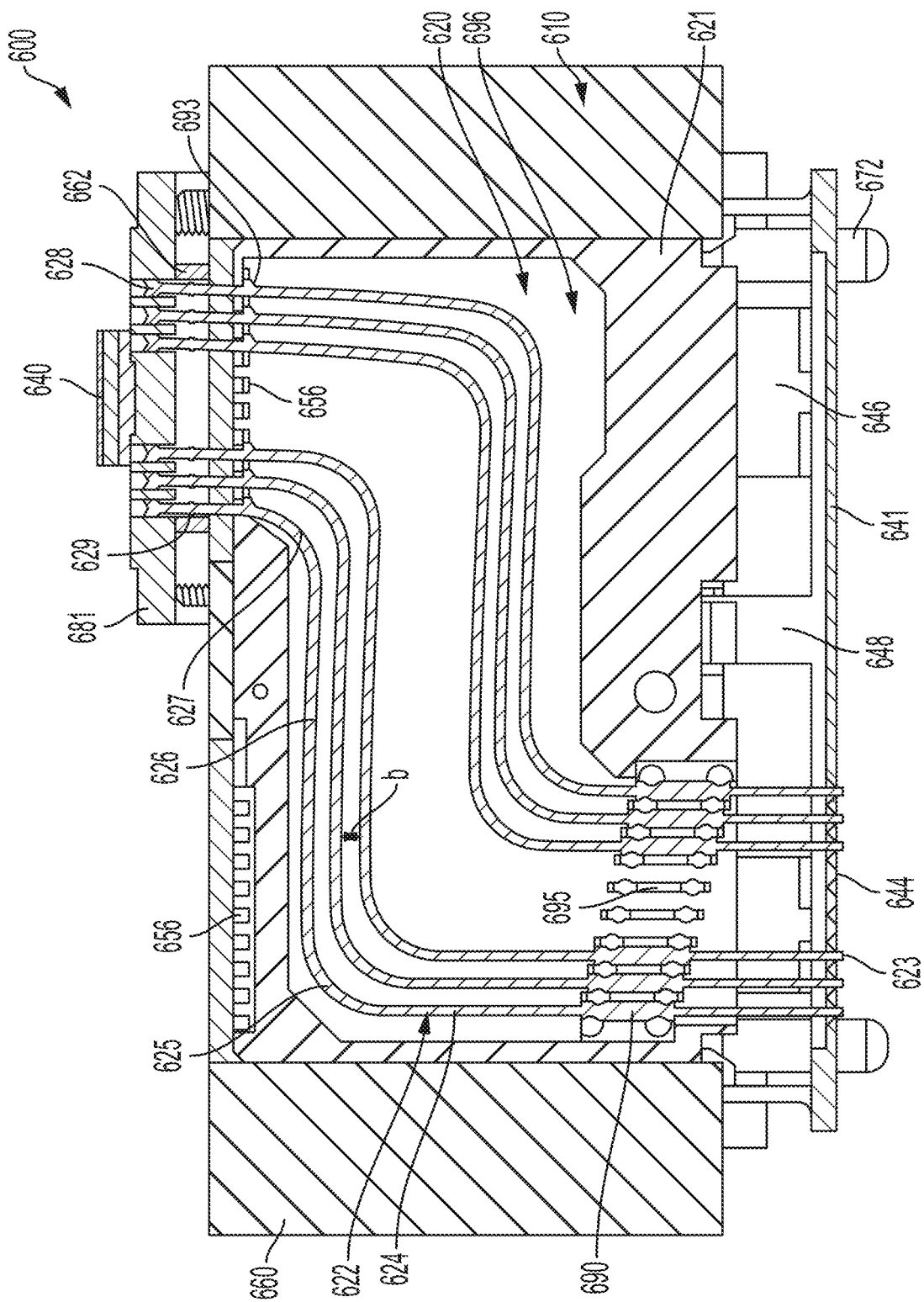
FIG. 6 is a cross-sectional view of another test socket in accordance with the subject technology.

Referring now to FIG. 6, still another embodiment of a test socket 600 in accordance with the subject technology is shown in cross-sectional view. Similar elements to those described in connection with above-described embodiments are indicated with the like reference numbers in the 600s. Many elements are similar or the same as those of the foregoing embodiments and, thus, are not further described herein. A primary difference between the embodiments above and test socket 600 is the pin assembly 620. It is noted that the burn-in board and backing plate are not shown in FIG. 6, The pin assembly 620 utilizes etched contact pins 622 which are housed within a base assembly 610 comprising a main body 660 of the test socket 600. Each contact pin 622 is fixed to a holder insert 621. The holder inserts 621 fixed with the pins 622 are stacked and held together by a shaft 648 to form the pin assembly 620 with a clearance 'b' between each contact pin 622. Once assembled, the pin assembly 620 is then inserted in the main body 660. It is envisioned that the pin assembly 620 includes a plurality of inserts 621 that are fabricated from thin plastic.

A lead guide 641 is connected to the main body 660. The lead guide 641 has at least one guide tongue 646 that fits in a corresponding slot (not shown) of the main body 660. The stopper 640 has alignment screws or posts 672 running through the main body 660 and the lead guide 641 for aligning the base assembly 610 and the pin assembly 620 together. The lead guide 641 has an array of holes 644 for receiving the contact pins 622.

The contacts pins 622 comprise a distal male end 623, a distal straight 624 region, a distal arc 625, an intermediate straight 626 region, a proximal arc 627, and a proximal female end 628. The distal male ends 623 of the contact pins 622 are stabilized in the main body 660 with a lower locking feature 690, upper locking feature 692, and an annular ridge 629 proximate the proximal female end 628 that interact with the holder inserts 621. The main body 660 has array of guide holes 656 for receiving the proximal female end 628 of the contact pins 622.

The lower locking feature 690 fixes the distal male end 623. In one embodiment, the inserts 621 form a necked down channel 695 that creates the lower locking feature 690 to prevent significant up or down motion of the respective pin 622. However, the upper locking feature 692 and the annular ridge 629 only limits upward travel of the proximal female end 628. As shown, the upper locking feature 692 includes a pin protrusion 693 that cannot pass into a respective guide hole 656 in the insert 694. As a result, the proximal female end 628 is free to move downward by resilient flexing or deformation of the distal straight 624 region, the distal arc 625, the intermediate straight 626 region and the proximal arc 627 but biased upwards by the resiliency of the material of the contact pin 622. In one embodiment, the contact pins 622 are etched from a sheet of metal to have a generally rectangular or square cross-section and the insert 694 forms an open interior 696 that allows the contact pins 622 to deform yet maintain clearance 'b' therebetween.

The embodiment shown in FIG. 6 further comprises a floating plate 681 slidably coupling to the top surface of the main body 660 and biased upward as described above. Again, during loading of the semiconductor device 602 on to the floating plate 681, the flex arms 662 splay to support the floating plate 681.

Although not shown in FIG. 6, the test socket 600 may have two or more floating plates so that multiple semiconductor devices are readied for testing on the single test socket 600. For simplicity, a second floating plate to the left is not shown. For the second plate, the contact pins are similarly fabricated and assembled but passing upwards from right to left without contacting other pins. In another embodiment, the contact pins are coated, spaced with spacers/inserts or otherwise separated to prevent electrical contact when assembled and during flexing.

The foregoing subject technology has a number of benefits over the known approaches, including, but not limited to ensuring flush contact between the semiconductor device and the thermal unit regardless of the thickness of the semiconductor device. With the latter being in place, the simultaneous testing of a sizable number of semiconductor devices, even with variable dimensions, becomes feasible. Being able to simultaneously test a sizable number of semiconductor devices reduces the need for multiple size appropriate testing ovens, overall cost and complexity. As can be seen, the capital costs, the cost of ownership, and the efficacy of burn-in testing of semiconductor devices are all improved by the subject technology.

It will be appreciated by those of ordinary skill in the pertinent art that the functions of several elements may, in alternative embodiments, be carried out by fewer elements, or a single element. Similarly, in some embodiments, any functional element may perform fewer, or different, operations than those described with respect to the illustrated embodiment. Also, functional elements shown as distinct for purposes of illustration may be incorporated within other functional elements in a particular implementation.

While the subject technology has been described with respect to various embodiments, those skilled in the art will readily appreciate that various changes and/or modifications can be made to the subject technology without departing from the scope of the present disclosure.

The invention claimed is:

1. A test socket assembly for a semiconductor device, comprising:
   a base assembly including: a pin assembly for electrically coupling to the semiconductor device for burn-in; and at least one upstanding flex arm;
   a floating plate slidably coupled to the base assembly, wherein the at least one upstanding flex arm supports the floating plate in a fixed load position when inserting the semiconductor device into the test socket assembly; and
   opposing latches mounted on the floating plate for movement therewith and for retaining the semiconductor device thereto, wherein each latch includes an upstanding clamp portion and a horizontal lever portion that is in contact with a latch spring.

2. The test socket assembly as recited in claim 1, wherein:
   the floating plate has four corners that form opposing gaps; and
   the at least one flex arm is four upstanding flex arms, each flex arm configured to selectively interact with the respective corner of the floating plate in the fixed load position.

3. The test socket assembly as recited in claim 2, further comprising a loading head comprising opposing inner shoulders with outer sidewalls, wherein:
   the loading head mounts on the test socket assembly so that the outer sidewalls splay the four upstanding flex arms outward to support the four corners of the floating plate in the fixed load position; and
   each flex arms includes an inward protrusion for contacting the respective outer sidewall of the inner shoulder of the loading head.

4. A test socket assembly for a semiconductor device, comprising: a base assembly including a pin assembly for electrically coupling to the semiconductor device for burn-in;
   a floating plate slidably coupled to the base assembly; and
   opposing latches mounted on the floating plate for movement therewith and for retaining the semiconductor device thereto, wherein the floating plate and the opposing latches move to a test position for accommodating a varying height of the semiconductor device when mating with a test fixture while the latch still effectively retains the semiconductor device, wherein each latch includes an upstanding clamp portion and a horizontal lever portion that is in contact with a latch spring.

5. The test socket assembly as recited in claim 4, wherein:
   the floating plate comprises a tongue for fitting into a slot formed in a main body of the base assembly for guiding movement of the floating plate with respect to the base assembly; and
   a maximum travel of the floating plate is equivalent to a clearance height 'h' between the floating plate and the main body.

6. The test socket assembly as recited in claim 5, further comprising a latch spring extending between the floating plate and the main body for biasing each opposing latch to a closed position for retaining the semiconductor device.

7. The test socket assembly as recited in claim 4, wherein the floating plate is biased away from the base assembly by four floating plate springs extending between the floating plate and the base assembly.

8. A test socket assembly for a semiconductor device, comprising:
   a base assembly including a pin assembly for electrically coupling to the semiconductor device for burn-in and at least one upstanding flex arm;
   at least one floating plate slidably coupled to the base assembly; and
   at least one latch assembly mounted on the at least one floating plate for movement therewith and for retaining the semiconductor device thereto, wherein the at least one floating plate and the at least one latch assembly move to a test position for accommodating a varying height of the semiconductor device when mating with a test fixture while the latch still effectively retains the semiconductor device and the at least one upstanding flex arm supports the floating plate in a fixed load position when inserting the semiconductor device into the test socket assembly, wherein each latch of the at least one latch assembly includes an upstanding clamp portion and a horizontal lever portion that is in contact with a latch spring.

9. The test socket assembly as recited in claim 8, wherein:
   the at least one floating plate has four corners that form opposing gaps; and
   the at least one flex arm is four upstanding flex arms, each flex arm configured to selectively interact with the respective corner of the floating plate in the fixed load position.

10. The test socket assembly as recited in claim 8, further comprising a loading head comprising opposing inner shoulders with outer sidewalls, wherein in the fixed load position, the loading head mounts on the test socket assembly so that the outer sidewalls splay the four upstanding flex arms outward to support the four corners of the at least one floating plate.

11. The test socket assembly as recited in claim 10, wherein:
    the opposing latches and the inner shoulders move in the opposing gaps;
    the at least one floating plate comprises a tongue for fitting into a slot formed in a main body of the base assembly for guiding movement of the at least one floating plate with respect to the base assembly;
    a maximum travel of the at least one floating plate is equivalent to a clearance height 'h' between the floating plate and the main body; and
    the at least one floating plate is biased away from the base assembly by four floating plate springs extending between the floating plate and the base assembly.

12. The test socket assembly as recited in claim 11, further comprising a latch spring extending between the floating plate and the main body for biasing each opposing latch to a closed position for retaining the semiconductor device.

13. The test socket assembly as recited in claim 8, wherein the pin assembly comprises contact pins comprising:
    a proximal female end proximate the floating plate and configured to connect to the semiconductor device, the proximal female end positioned orthogonally to the floating plate;
    an intermediate straight region connected to the proximal female end and positioned parallel to the floating plate; and
    a distal male end distal the floating plate and connected between a lead guide and the intermediate straight region, the distal male end positioned orthogonally to the floating plate.

14. The test socket assembly as recited in claim 8, wherein the at least one latch assembly comprises opposing latches mounted on the at least one floating plate for movement therewith and for retaining the semiconductor device thereto, wherein the floating plate and the opposing latches move to a test position for accommodating a varying height of the semiconductor device when mating with the test fixture while the latch still effectively retains the semiconductor device.

15. The test socket assembly as recited in claim 13, wherein the contact pins further comprising:
  a proximal arc connecting proximal female end to the intermediate straight region; and
  a distal arc connecting a distal straight region of the distal male end and the intermediate straight region wherein:
  the contact pin is biased to move away from the base assembly;
  the distal straight region of the distal male end includes a lower locking feature which immovably couples the distal male end to the test socket assembly; and
  the proximal female end has a upper locking feature distal the proximal female end and proximate the proximal arc, a respective guide hole of the contact pins preventing the upper locking feature from passing therethrough.

* * * * *